United States Patent [19]

Robillard

[11] Patent Number: 5,098,806
[45] Date of Patent: Mar. 24, 1992

[54] PHOTOSENSITIVE ELEMENTS BASED ON POLYMERIC MATRICES OF DIACETYLENES AND SPIROPYRANS AND THE USE THEREOF AS COATINGS TO PREVENT DOCUMENT REPRODUCTION

[75] Inventor: Jean J. Robillard, El Paso, Tex.

[73] Assignee: Board of Regents, The University of Texas System, Austin, Tex.

[21] Appl. No.: 411,386

[22] Filed: Sep. 22, 1989

[51] Int. Cl.$^5$ .................................................. G03C 3/00
[52] U.S. Cl. ...................................... 430/10; 430/339; 430/345; 522/14; 522/16; 522/25; 522/181
[58] Field of Search ................. 430/10, 339, 1, 345; 522/14, 16, 25, 181

[56] References Cited

U.S. PATENT DOCUMENTS

| | | | |
|---|---|---|---|
| 3,451,338 | 6/1969 | Baum | 430/357 |
| 3,597,082 | 8/1971 | James et al. | 430/10 |
| 3,642,484 | 2/1972 | Poot et al. | 430/345 |
| 4,237,207 | 12/1980 | Ceintrey | 430/17 |
| 4,696,876 | 9/1987 | Cael | 430/331 |
| 4,699,872 | 10/1987 | Robillard | 430/336 |
| 4,711,830 | 12/1981 | Hasuta et al. | 430/563 |
| 4,725,527 | 2/1988 | Robillard | 430/339 |
| 4,751,387 | 6/1988 | Robillard | 250/331 |
| 4,905,202 | 2/1990 | Robillard | 367/8 |

FOREIGN PATENT DOCUMENTS

| | | | |
|---|---|---|---|
| 1149697 | 4/1969 | United Kingdom | 430/270 |
| 1441255 | 6/1976 | United Kingdom | 430/345 |

OTHER PUBLICATIONS

C. Smets et al., "Photochromic Polymers and Their Solution Behavior", Polymer Preprints (American Chemical Society, Div. Polym. Chem.) 9 (1968) pp. 211-217.

Hay et al., "Photosensitization of Polyacetylenes", J. of Polymer Science: Part A-1, vol. 8 (1970) pp. 1022-1023.

Primary Examiner—Cynthia Hamilton
Attorney, Agent, or Firm—Arnold, White & Durkee

[57] ABSTRACT

Rapid changes in absorption are made within the volume of a photosensitive transparent member that absorbs incident radiation to prevent the photocopy of a document, the original transparency being restored after discontinuance of the incident radiation.

29 Claims, 4 Drawing Sheets

PHOTOSENSITIVE ELEMENTS BASED ON POLYMERIC MATRICES OF DIACETYLENES AND SPIROPYRANS AND THE USE THEREOF AS COATINGS TO PREVENT DOCUMENT REPRODUCTION

BACKGROUND OF THE INVENTION

1. Field of the Invention

This invention relates to radiation blocking systems and in particular to methods and materials used as coatings to prevent document reproduction.

2. Description of Related Art

Photochromic materials, in particular the spiropyrans, are candidates for many light controlling applications such as, sun glasses, optical switches, Q switches, photochromic images, optical data processing and fast response filters to prevent the reproduction of documents. In the latter case the response speed of the filter should be faster than the time required to reach the threshold of detectability in the photosensitive element of the reproduction (e.g. photocopy) machine. The response times of certain spiropyrans are typically in the nano or pico second range when activated in a solution of a suitable solvent, but their conditioning into films or coatings typically requires the presence of a plastic binder which decreases considerably the reaction speed and prevents the reversibility of the phenomenon. The conditionment into film is otherwise necessary to the use of spiropyrans for preventing the reproduction of a document.

Accordingly, it is an objective of this invention to address at least some of the above noted difficulties.

Another objective of this invention is to develop radiation blocking materials that are photosensitive to the radiations utilized for the copying and/or reproduction of documents.

Still another objective of the present invention is to devise coatings or films capable of generating a blocking filter for said radiations in a time less than the time threshold of the recording photosensor.

A further objective of the present invention is to develop coatings or films capable of restoring original viewing transparency after the filtering action preventing the reproduction of a document.

Yet another objective of this invention is to develop coatings or films capable of blocking the radiations generated by conventional xerographic techniques to prevent the reproduction of a document without altering the readability of the document under normal viewing conditions.

A specific objective of this invention is the fabrication of coatings or films to prevent the reproduction of a document.

SUMMARY OF THE INVENTION

These and other objectives are addressed by this invention with a photosensitive member fabricated by crosslinking diacetylene monomers utilizing spiropyrans as crosslinks and a photosensitizing dye. The dye may enable the polydiacetylene to respond to radiations within the visible spectrum used for the reproduction of a document, thereby causing the spiropyrans to open into their colored form. At substantially the same time, the spiropyran itself may absorb the ultraviolet part of the spectrum, also providing ring opening in its colored form. The two concurrent actions may result in a deep coloration of the film, which substantially prevents the recording of the optical pattern representing the document.

Once the radiation ceases to exist, the spiropyran may return to its closed form and the film may revert to transparency.

The interaction of the diacetylene chains in the polymer with the spiropyran links may create conditions for selective response to a specific spectral distribution of the printing light as well as a given rise time of the light pulse. These conditions can be adjusted by the length and composition of the link containing the spiropyran, thus creating various degrees of conjugation between the pi-orbitals of the spiropyran and of the monomer chains. The introduction of a carbonyl group (See FIG. 6) in the link may provide a continuous intramolecular overlap of pi-orbitals extending from the spiropyran to the diacetylene chains. Stabilized orbital delocalization corresponding to specific electronic states can be made to match a given spectral distribution in the printing light and allow the system to differentiate from ambient reading light.

Another element of differentiation is related to the kinetics of ring opening of the spiropyran in the presence of other active groups in the link itself or in the monomer chains. Multistable states can relate to the rise time of the printing pulse.

In view of these considerations, crosslinked polymer structures which will respond specifically to the printing light while remaining unaffected by ambient reading light may be designed in accordance with this invention. The specificity may be determined by a number of factors, such as the choice of the diacetylene monomer, of the spiropyran, the length and composition of the link containing the spiropyran, the absorption spectrum of the spiropyran and that of the photosensitizer.

DETAILED DESCRIPTION OF PREFERRED EMBODIMENTS

The photosensitive element of the present invention may be formed by simultaneous polymerization and crosslinking of a diacetylene monomer in the presence of a modified spiropyran and a dye sensitizer.

The polymer structure generally comprises three elements, namely the spiropyran, the diacetylene monomer and the dye sensitizer.

The Spiropyrans

The spiropyrans are organic molecules which can be represented as follows (R1 represents a hydrocarbon group, aliphatic or aromatic):

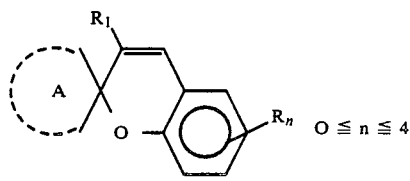

$0 \leq n \leq 4$

The n identical or different groups represent groups such as NO$_2$, CH$_2$Cl, alkoxy (preferably OCH$_3$) or a ring, for example the benzene ring when n=2.

The benzopyran part with various substitutions is always included. Part (A) represents various heterocyclic systems, those most frequently encountered being shown in Table 1.

TABLE 1

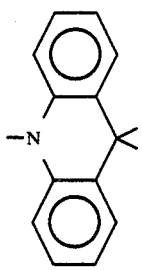

| | | |
|---|---|---|
| | X = C(CH$_3$)(CH$_3$) | Y = N indoline |
| | X = S | Y = N benzothiazoline |
| | X = O | Y = N benzoxazoline |
| | X = N | Y = N benzimidazoline |
| | X = Se | Y = N benzoselenazoline |
| | X = CH=CH | Y = N quinoline (or iso) |
| | X = S | Y = S benzodithiol |
| | X = S | Y = O benzoxathiol |
| | X = CH=CH | Y = O benzopyran |
| | X = S | Y = S dithiol |
| | X = S | Y = O oxathiol |
| | X = S | Y = N thiazolidine |
| | X = O | Y = N oxazolidine |
| | X = CH$_2$ | Y = N pyrrole |
| | X = O | Y = N 1,3-oxazine |
| | X = S | Y = N 1,3-thiazine |
| | X = CH$_2$ | Y = N piperidine |

1,4-thiazine phenanthridine xanthene acridine

The properties of these photochromic compounds have been described in many books and publications. An exhaustive study is presented in G. H. Brown's book "Photochromism" (Wiley, Interscience). Spiropyrans are typically uncolored in their closed form, but can be reversibly opened and transformed in colored merocyanines under ultraviolet irradiation. The merocyanine can be reverted into spiropyran either thermally or photochemically, by irradiation in the absorption band of the merocyanine, which is in the visible.

Preferred spiropyrans for use in this invention are the benzothiazoline where X=S and Y=N (See Table 1) because of high response speed (t picosecond).

When spiropyrans enter into solid solution in a conventional binder to form a film, the response time may be considerably reduced due to hinderance from the binder molecules, but when they become part of a polymer structure as in the present invention the speed is generally unaffected.

In a preferred embodiment, the polymer matrix comprises a coating having thickness from about 1 to 10 microns.

The Diacetylene Monomer

Figure 1:
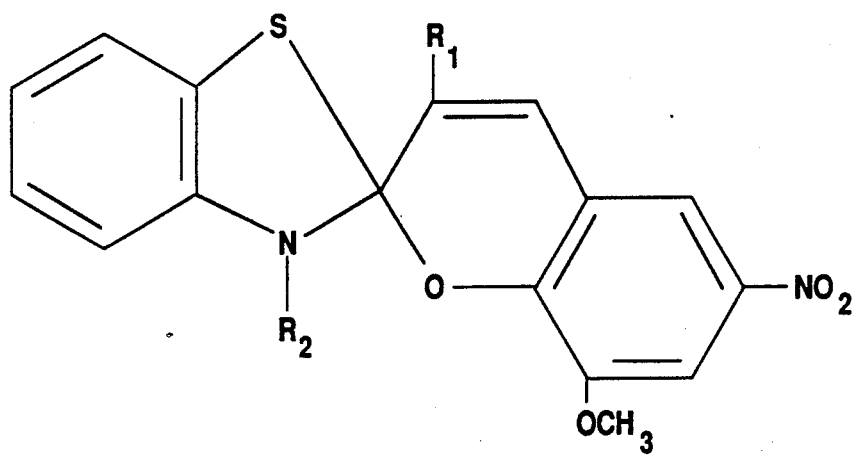
FIG. 1 represents the molecular structure of a spiropyran.
Figure 2A:
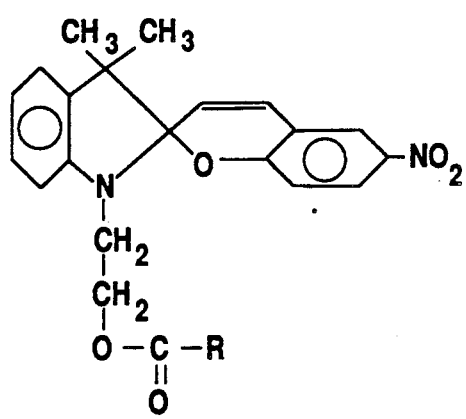
FIG. 2 shows a number of spiropyrans preferred in the practice of the present invention.
Figure 2B:
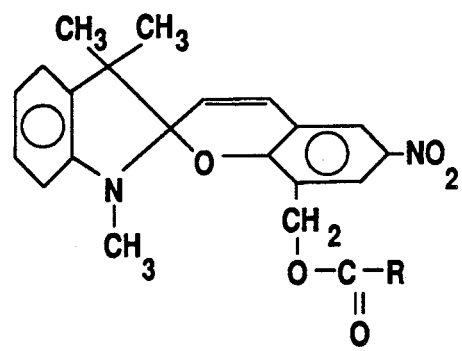
Figure 2C:
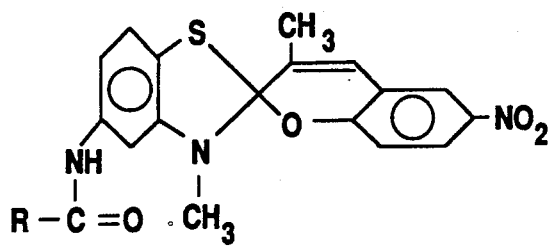
Figure 2D:
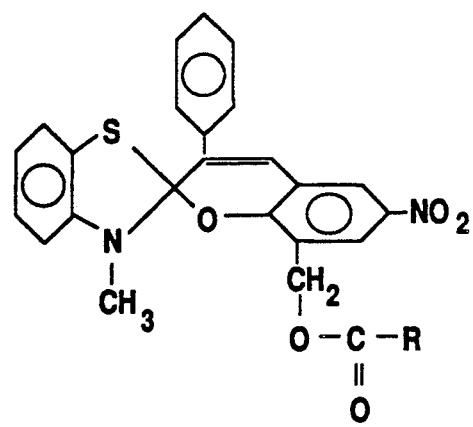
Figure 3A:
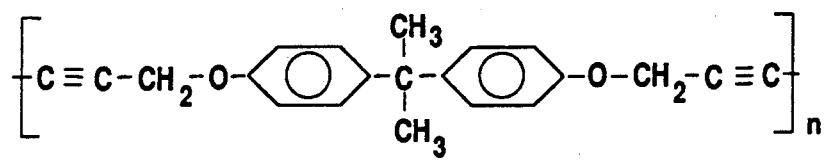
FIG. 3 illustrates various structures of polydiacetylenes.
Figure 3B:
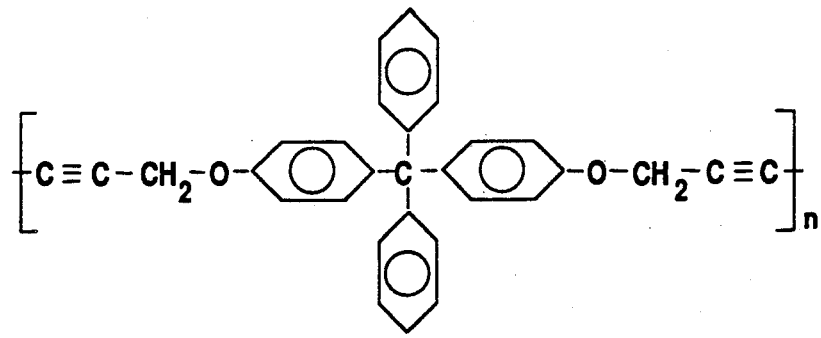
Figure 3C:
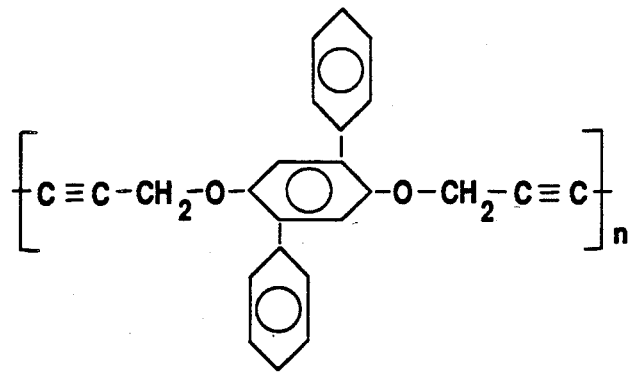
Figure 3D:
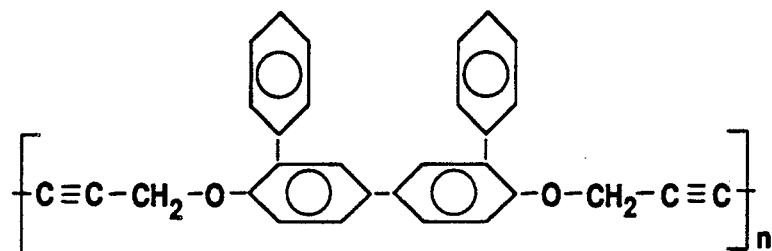
Figure 3E:
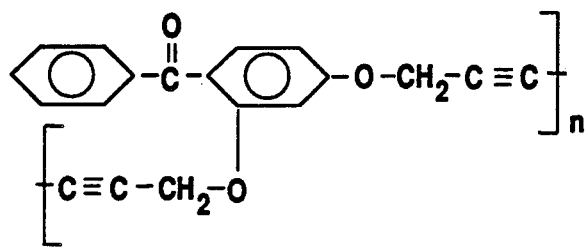
Figure 4:
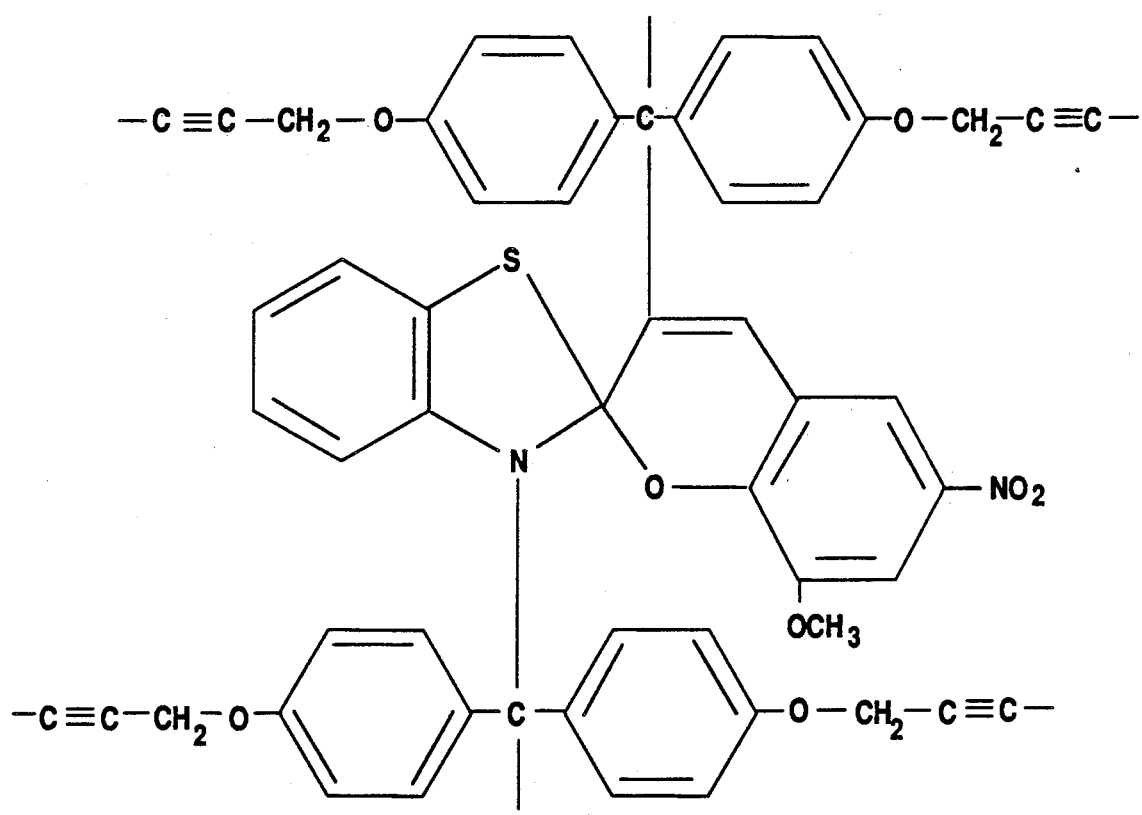
FIG. 4 shows a polydiacetylene crosslinked by a benzothiazol spiropyran.
Figure 5:
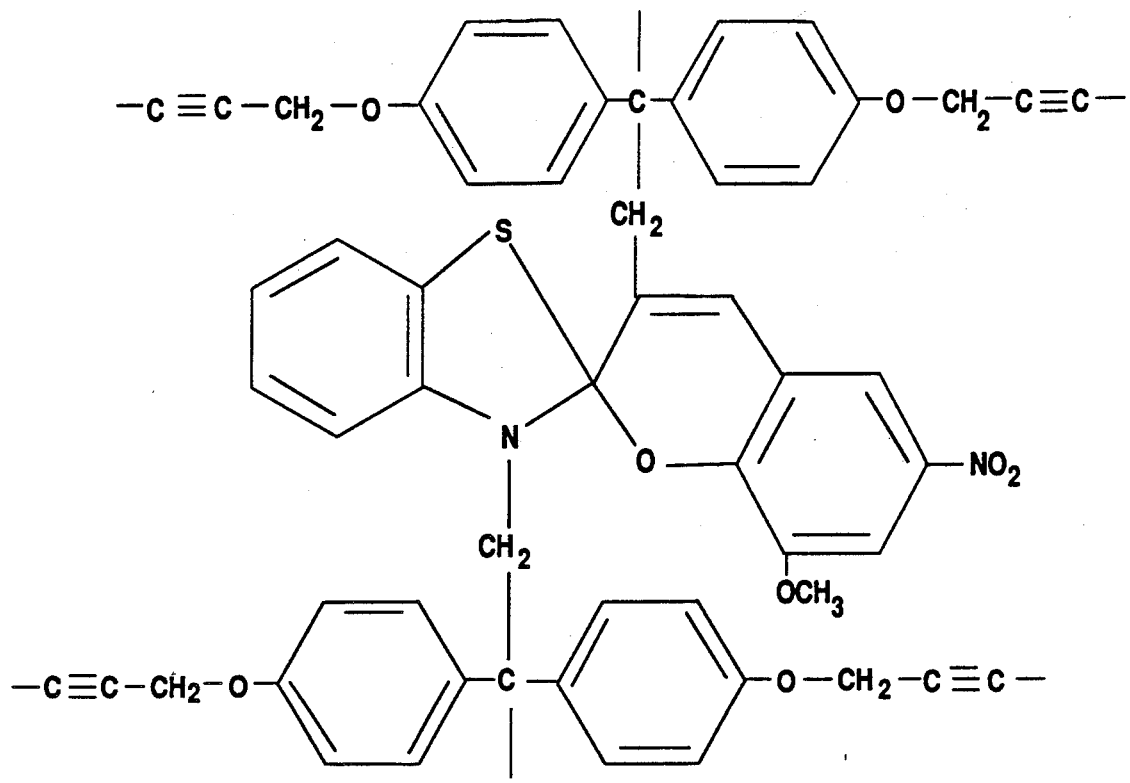
FIG. 5 represents a polydiacetylene crosslinked by a benzothiazol spiropyran and two CH2 groups.
Figure 6:
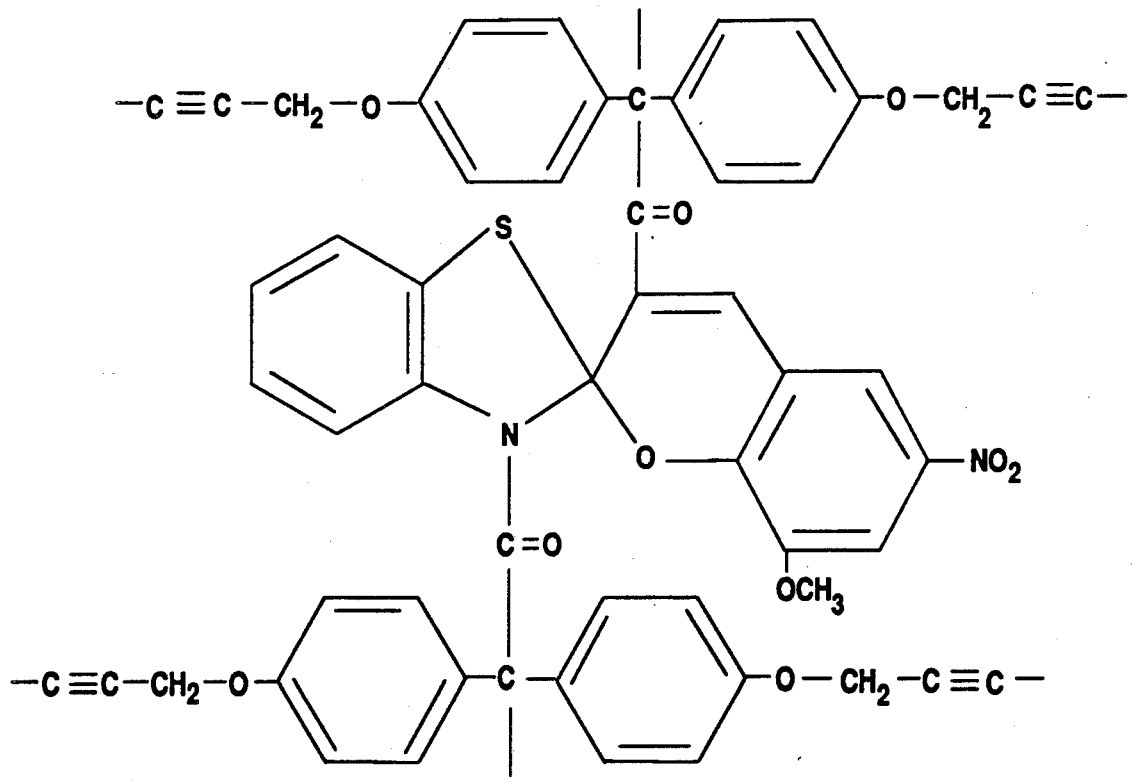
FIG. 6 represents a polydiacetylene crosslinked by a benzothiazol spiropyran and two carbonyl groups.

A variety of diacetylene monomers can be used to build up the polymer according to this invention. Some of them are listed in FIG. 3. A preferred one is the bisphenol A dipropargyl ether:

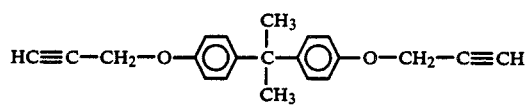

The Dye Sensitizer

Preferably, the dye sensitizer includes erythrosin, auramine, or ethyl violet.

Various preferred embodiments as described may provide systems employing the use of a crosslinked polymer structure containing a fast response photosensitive element in the crosslink which interacts with photoconductive polymer chains to provide a bi-stable filter. The polymer in the form of a coating may be used to substantially prevent the reproduction of a document by darkening at a speed superior to the time delay necessary to trigger the activation of the photosensitive element in a photocopier. Such polymer may be designed to react only to a specific spectral distribution of the light source used in the photocopier, thus substantially preventing filtering action under normal reading light.

EXAMPLE

Preparation of the diacetylene monomer:

The monomer may be obtained by reaction of 4,4′isopropylenediphenol (Bisphenol A) and propargyl bromide in acetone in the presence of potassium carbonate. The mixture is refluxed for 72 hours.

Polymerization and Crosslinking

A methyl alcohol solution containing the monomer and a spiropyran in stoichiometric proportions, a dye sensitizer and small quantities of benzophenone may be spread and polymerized on the surface of a document by exposure to ultraviolet radiations for five minutes.

Although the foregoing description, drawings, and example present the invention in terms of specific methods, materials and applications, it will be apparent to those skilled in the art that other materials may be substituted, other manufacturers followed and other uses found. All such substitutions and changes consistent with polydiacetylenes crosslinked by spiropyran compounds are within the scope of the present invention.

What is claimed is:

1. A radiation sensitive material capable of being rendered substantially opaque to readout radiation when exposed to light of a document reproduction machine, said material comprising a dye sensitizer, and a polydiacetylene crosslinked with a spiropyran, wherein the spiropyran includes a benzopyran part, and wherein the polydiacetylene has the formula:

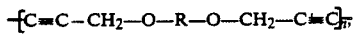

where R includes at least one benzene ring and n is an integer.

2. The material of claim 1, wherein the spiropyran is a indoline spiropyran, a benzothiazoline spiropyran, a benzoxazoline spiropyran, a benzimidazoline spiropyran, a benzoselenazoline spiropyran, a quinoline spiropyran, an isoquinoline spiropyran, a benzodithiol spiropyran, a benzoxathiol spiropyran, a benzopyran spiropyran, a dithiol spiropyran, an oxathiol spiropyran, a thiazolidine spiropyran, an oxazolidine spiropyran, a pyrrole spiropyran, a 1,3-oxazine spiropyran, a 1,3-thiazine spiropyran, a piperidine spiropyran, a 1,4-thiazine spiropyran, a phenanthridine spiropyran, a xanthene spiropyran, or an acridine spiropyran.

3. The material of claim 1, wherein the spiropyran is an indoline spiropyran, a benzothiazoline spiropyran, or a benzoxazoline spiropyran.

4. The material of claim 1, wherein the spiropyran comprises a benzothiazoline spiropyran.

5. The material of claim 1 which is obtained by simultaneous polymerization of a diacetylene and crosslinking with the spiropyran.

6. The material of claim 1, wherein the polydiacetylene is poly(bisphenol A dipropargyl ether), poly(4,4′-tetraphenyldipropargyl ether), poly(3,6-diphenylbenzodipropargyl ether), poly(3,3′-diphenyl 4,4′-diphenyldipropargyl ether), or poly(4,6-dipropargyl ether benzophenone).

7. The material of claim 1, wherein the diacetylene is bisphenol A dipropargyl ether, 4,4′-tetraphenyldipropargyl ether, 3,6-diphenylbenzodipropargyl ether, 3,3′-diphenyl 4,4′-diphenyldipropargyl ether, or 4,6-dipropargyl ether benzophenone.

8. The material of claim 1, wherein the polydiacetylene comprises poly(bisphenol A dipropargyl ether).

9. The material of claim 5, wherein the diacetylene comprises bisphenol A dipropargyl ether.

10. The material of claim 1, wherein the dye sensitizer is erythrosin, auramine, or ethyl violet.

11. The material of claim 1 which comprises a coating on a document.

12. The material of claim 11, wherein the coating has a thickness from abut 1 to 10 microns.

13. The material of claim 1 which does not respond to continuous light exposure.

14. The material of claim 1 which is substantially transparent prior to exposure to light of a document reproduction machine, and is capable of returning substantially to tis original transparency upon removal of such light.

15. A process for preventing the reproduction of a document, comprising coating a document with a radiation sensitive material capable of being rendered substantially opaque to readout radiation when exposed to light of a document reproduction machine, said material comprising a dye sensitizer, and a polydiacetylene crosslinked with a spiropyran, wherein the spiropyran includes a benzopyran part, and wherein the polydiacetylene has the formula:

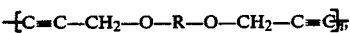

where R includes at least one benzene ring and n is an integer.

16. The process of claim 15, wherein the spiropyran is an indoline spiropyran, a benzothiazoline spiropyran, a benzoxazoline spiropyran, a benzimidazoline spiropyran, a benzoselenazoline spiropyran, a quinoline spiropyran, an isoquinoline spiropyran, a benzodithiol spiropyran, a benzoxathiol spiropyran, a benzopyran spiropyran, a dithiol spiropyran, an oxathiol spiropyran, a thiazolidine spiropyran, an oxazolidine spiropyran, a pyrrole spiropyran, a 1,3-oxazine spiropyran, a 1,3-thiazine spiropyran, a piperidine spiropyran, a 1,4-thiazine spiropyran, a phenanthridine spiropyran, a xanthene spiropyran, or an acridine spiropyran.

17. The process of claim 15, wherein the spiropyran is an indoline spiropyran, a benzothiazoline spiropyran, or a benzoxazoline spiropyran.

18. The process of claim 15, wherein the spiropyran comprises a benzothiazoline spiropyran.

19. The process of claim 15, further comprising the step of exposing the coated document to light of a document reproduction machine having a photosensitive element, such that the material becomes substantially opaque to readout radiation, thereby preventing reproduction of the document by said machine.

20. The process of claim 19, wherein said photosensitive element has a time threshold for activation, and wherein the material becomes substantially opaque to readout radiation in a time shorter than said time threshold for activation.

21. The process of claim 19, wherein the material becomes opaque to an extent sufficient to prevent activation of the photosensitive element of the document reproduction machine and formation of a latent image on said photosensitive element.

22. The process of claim 19, wherein the radiation sensitive material is substantially transparent prior to exposure of the coated document to the light of the document reproduction machine.

23. The process of claim 22, further comprising the step of removing the light of the document reproduction machine, whereby the radiation sensitive material returns substantially to its original transparency.

24. The process of claim 15, wherein the radiation sensitive material does not respond to continuous light exposure.

25. The process of claim 19, wherein the material responds to a specific spectral distribution of the light of the document reproduction machine.

26. The process of claim 15, wherein the radiation sensitive material is coated on the document to a thickness of from about 1 to 10 microns.

27. The process of claim 15, wherein the polydiacetylene is poly(bisphenol A dipropargyl ether), ether), poly(4,4'-tetraphenyldipropargyl ether), poly(3,6-diphenylbenzodipropargyl ether), poly(3,3'-diphenyl 4,4'-diphenyldipropargyl ether), or poly(4,6-dipropargyl ether benzophenone).

28. The process of claim 15, wherein the polydiacetylene comprises poly(bisphenol A dipropargyl ether).

29. The process of claim 15, wherein the dye sensitizer is erythrosin, auramine, or ethyl violet.

* * * * *

UNITED STATES PATENT AND TRADEMARK OFFICE
CERTIFICATE OF CORRECTION

PATENT NO.   : 5,098,806
DATED        : March 24, 1992
INVENTOR(S)  : Robillard

It is certified that error appears in the above-identified patent and that said Letters Patent is hereby corrected as shown below:

```
In claim 7 at column 5, line 62, change "1" to --5--.

In claim 14 at column 6, line 14, change "tis" to --its--.

In claim 27 at column 8, line 2, delete the second
occurrence of "ether),".
```

Signed and Sealed this

Fifteenth Day of June, 1993

Attest:

MICHAEL K. KIRK

*Attesting Officer*   Acting Commissioner of Patents and Trademarks